(12) United States Patent
Smith

(10) Patent No.: US 6,456,161 B2
(45) Date of Patent: Sep. 24, 2002

(54) ENHANCED SLEW RATE IN AMPLIFIER CIRCUITS

(75) Inventor: Steven Obed Smith, Loveland, CO (US)

(73) Assignee: Fairchild Semiconductor Corporation, DE (US)

( * ) Notice: Subject to any disclaimer, the term of this patent is extended or adjusted under 35 U.S.C. 154(b) by 0 days.

(21) Appl. No.: 09/878,477

(22) Filed: Jun. 11, 2001

Related U.S. Application Data

(60) Provisional application No. 60/211,463, filed on Jun. 13, 2000.

(51) Int. Cl.[7] ................................................. H03F 3/45
(52) U.S. Cl. ...................................... 330/252; 330/253
(58) Field of Search ................................. 330/252, 253

(56) References Cited

U.S. PATENT DOCUMENTS 4,881,045 A * 11/1989 Dillman ....................... 330/253
5,446,412 A * 8/1995 Kimyacioglu et al. ...... 330/253
5,818,295 A * 10/1998 Chimura et al. ............. 330/253
6,160,450 A * 12/2000 Eschauzier et al. ......... 330/253

* cited by examiner

Primary Examiner—Robert Pascal
Assistant Examiner—Patricia T. Nguyen
(74) Attorney, Agent, or Firm—Skjerven Morrill LLP; Philip W. Woo; Rahul D. Engineer

(57) ABSTRACT

An amplifier circuit comprising an input stage capable of receiving and amplifying an input signal, a gain stage electrically coupled to the input stage that is capable of further amplifying the input signal, and an output stage electrically coupled to the gain stage that is capable of charging a capacitance of the amplifier circuit and outputting the amplified input signal. The gain stage of the amplifier circuit comprises a pair of gain transistors with base terminals that are electrically coupled to the input stage, collector terminals that are electrically coupled to a path to ground, and emitter terminals that are electrically coupled to the output stage.

14 Claims, 3 Drawing Sheets

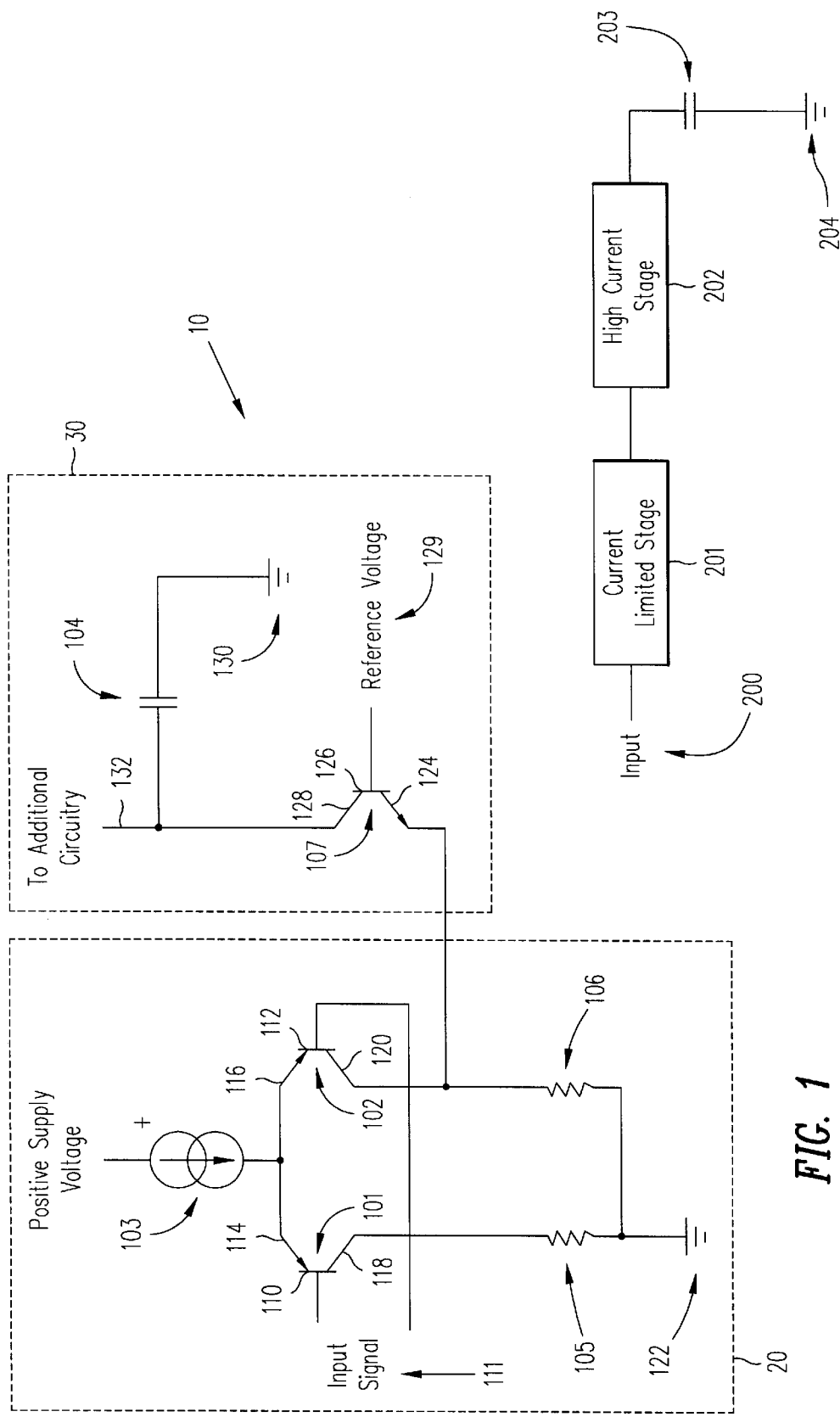

ENHANCED SLEW RATE IN AMPLIFIER CIRCUITS

This application claims priority from Provisional application Ser. No. 60/211,463, filed Jan. 13, 2000.

BACKGROUND

1. Field of the Invention

The invention relates generally to the field of electronic circuits, and more particularly, to enhancing slew rates in electronic circuits such as amplifier circuits.

2. Background Information

The present invention relates generally to high speed equipment such as communication systems, displays, and the like, ranging from cell phones to computer displays, in which the large signal behavior of the amplifier is an important consideration. The present invention involves a variety of designs which may provide techniques to achieve good large signal behavior in a variety of circuit arrangements.

Analog circuit elements in a system need to apply a specified signal swing to the next element in the circuit. The next element often has a required signal swing for maximum dynamic range, such as the full scale level of an analog to digital converter. As systems evolve for use at higher bandwidths, analog circuit elements, particularly elements with feedback, reach their large signal limits. Large signal performance is usually measured as slew rate, defined as the maximum rate of voltage change possible for a circuit at a given node.

The classic slew rate limit in an amplifier often occurs when a stage in the amplifier (usually an input stage) has a fixed maximum current, and this stage must charge capacitance. This is illustrated in FIG. 1, which shows an amplifier circuit 10 that includes an input stage 20 and an output stage 30. Input stage 20 supplies a current with a fixed maximum to output stage 30, and this current can be applied to a capacitor 104 that resides in output stage 30.

As shown in FIG. 1, input stage 20 includes a differential pair of transistors 101 and 102 that receive a differential input signal 111 at their respective base terminals 110 and 112. Differential input signal 111 controls how much current flows through transistors 101 and 102. A current generator 103 is coupled to transistors 101 and 102 at their respective emitter terminals 114 and 116. Current generator 103 provides amplifier circuit 10 with current, and this current typically has a fixed maximum. Therefore, the maximum current that transistors 101 and 102 can apply to output stage 30, and ultimately to capacitor 104, is the current generated by current generator 103. This can then determine the maximum charging rate of capacitor 104 by the current-voltage relationship for a capacitor:

$$\frac{\partial V}{\partial t} = \frac{I}{C}$$

where $$\frac{\partial V}{\partial t}$$

is the time rate of change of voltage (slew rate), I is the current 103 and C is the capacitance 104.

To complete the circuit of input stage 20, transistors 101 and 102 include a pair of collector terminals 118 and 120 that are electrically coupled to a pair of resistors 105 and 106. Resistors 105 and 106 are in turn coupled to a path to ground 122.

Output stage 30 includes a transistor 107 with an emitter terminal 124 that is electrically coupled to collector terminal 120 of transistor 102. Transistor 107 is operated by a reference voltage 129 that is applied to a base terminal 126 of transistor 107. Transistor 107 also has a collector terminal 128 that is coupled to capacitor 104 via output line 132, and capacitor 104 is in turn coupled to a path to ground 130. Output line 132 is typically connected to additional circuitry that is unrelated to amplifier circuit 10 for the purposes of this description, and is therefore not shown.

While there are a variety of techniques in use to improve slew rate, no single design achieves its goals without limiting performance in other areas. For instance, a common technique well known in the art is input stage degeneration. This technique does provide larger slew rates, but it increases noise and degrades open loop gain. Another common technique uses an input stage which is not current limited, one example of which is set forth in U.S. Pat. No. 5,049,653 issued to Smith, et al., which is hereby incorporated by reference. This technique is commonly used in current feedback amplifiers, and has been implemented in voltage feedback amplifiers as well. The drawback of a non-current limited input stage is that more voltage is required to bias the stage, making it not usable in low supply voltage or battery applications.

In addition, it is not feasible to use a non-current limited input stage in single supply applications which require the input common mode range to include one or both supplies. Thus, even though solutions to the problems mentioned in this disclosure have existed, none are believed to have provided the proper balance of competing concerns in most applications and certainly none have met the various criteria which may now be met by the present invention, especially in the low voltage, single supply or battery operated area or the like. Accordingly, there is a need for an improved amplifier system and method that does not limit the slew rate of a circuit.

SUMMARY

The disadvantages and problems associated with current limited stage amplifiers and other similar circuits have been improved using the present invention.

In accordance with an embodiment of the invention, an amplifier circuit comprises an input stage capable of receiving and amplifying an input signal, a gain stage capable of further amplifying the input signal, wherein the gain stage is electrically coupled to the input stage, and an output stage capable of charging a capacitance of the amplifier circuit and outputting the amplified input signal, wherein the output stage is electrically coupled to the gain stage.

According to another embodiment of the invention, the input stage of the amplifier circuit comprises a differential pair of transistors, each transistor comprising a base, an emitter, and a collector, a current generator electrically coupled to the emitters of the differential pair of transistors, a pair of input lines electrically coupled to the bases of the differential pair of transistors, the input lines configured to carry an input signal, a pair of resistors electrically coupled to the collectors of the differential pair of transistors, and a path to ground electrically coupled to the pair of resistors.

According to yet another embodiment of the invention, the gain stage of the amplifier circuit comprises a pair of gain transistors, each gain transistor comprising a base, an emitter, and a collector, wherein the bases of the gain transistors are electrically coupled to the input stage, wherein the collectors of the gain transistors are electrically coupled to a path to ground, and wherein the emitters of the gain transistors are electrically coupled to the output stage.

And according to yet another embodiment of the invention, the output stage of the amplifier circuit comprises a pair of output transistors, each output transistor comprising a base, an emitter, and a collector, wherein the emitters are electrically coupled to the gain stage, a reference voltage line electrically coupled to the bases of the output transistors, the reference voltage line configured to carry a reference voltage signal, and a pair of output lines electrically coupled to the collectors of the output transistors.

An important technical advantage of the present invention includes applying the amplified input signals produced in the input stage of an amplifier circuit to the base terminals of transistors in a gain stage of the amplifier circuit. This configuration breaks the typically direct relationship between the input stage and the output stage of an amplifier circuit. So here, when the low current, input stage signals are disassociated from the output stage of the amplifier circuit, the output stage is free to operate at higher currents. The result is an increase in the slew rate of the amplifier circuit.

BRIEF DESCRIPTION OF THE DRAWINGS

For a more complete understanding of the present invention and for further features and advantages, reference is now made to the following description taken in conjunction with the accompanying drawings, in which:

FIG. 1 is a schematic diagram of a circuit that shows the source of slew rate limitation;

FIG. 2 is a block diagram illustrating an embodiment of the invention;

DETAILED DESCRIPTION

Figure 3:
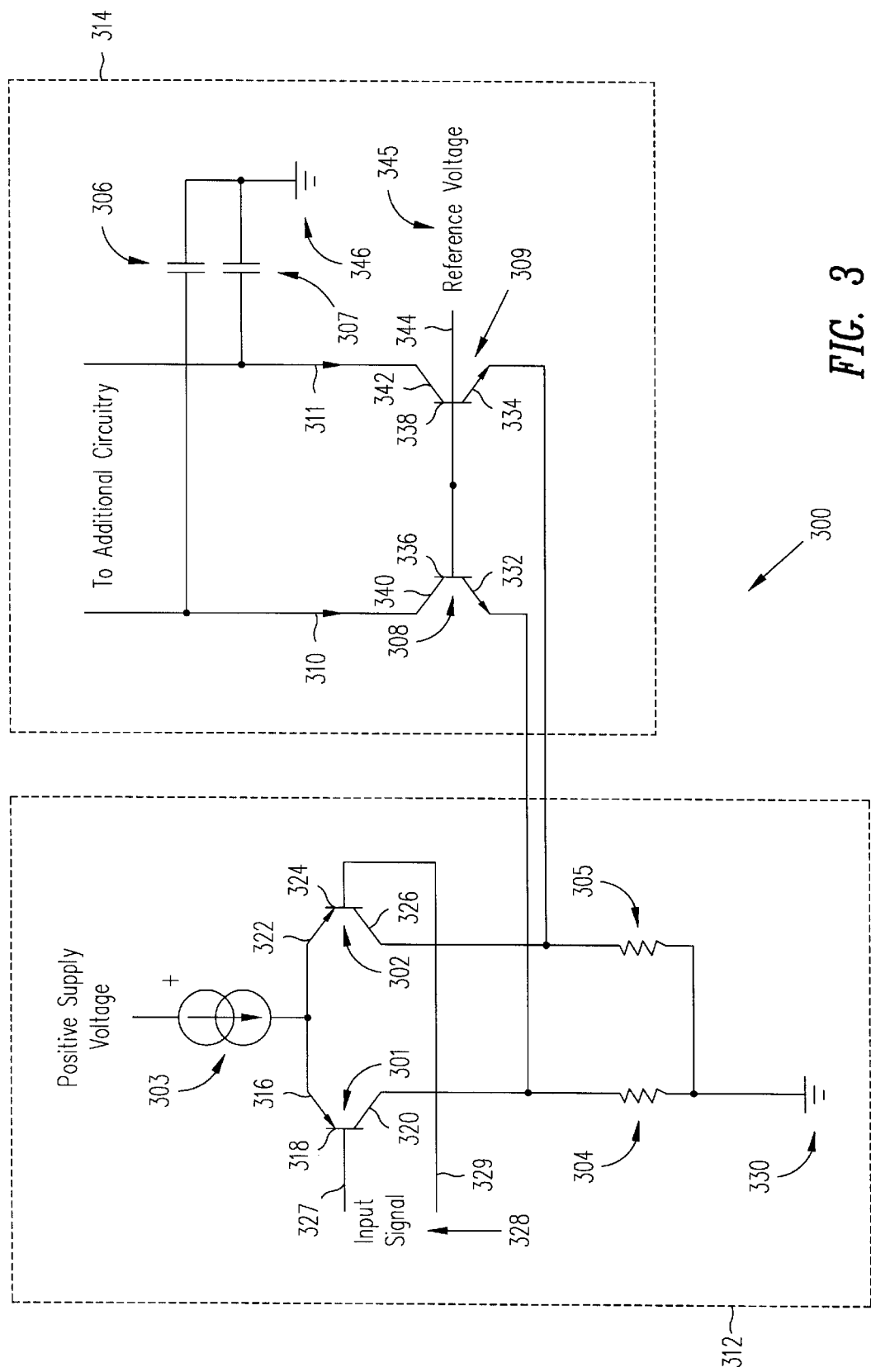
FIG. 3 is a schematic diagram of a known circuit with slew rate limitation.
Figure 4:
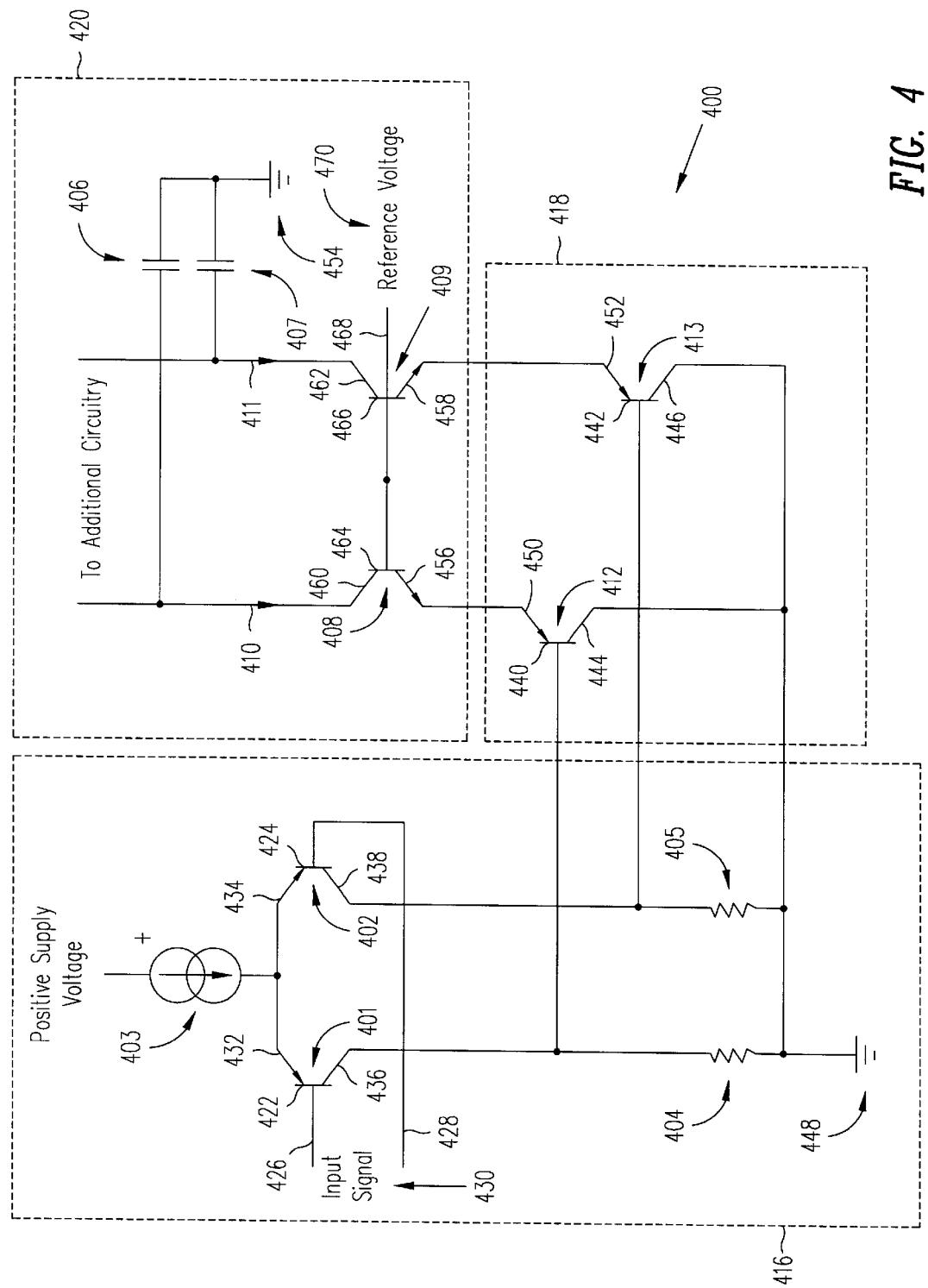
FIG. 4 is a schematic diagram of a circuit constructed according to an embodiment of the invention.

The embodiments of the present invention and their advantages are best understood by referring to FIGS. 2 through 4 of the drawings. Like numerals are used for like and corresponding parts of the various drawings.

The invention includes systems and methods for providing electronic circuits that have a high slew rate relative to known systems. In addition to increasing the slew rate, the invention has many other practical considerations, such as not increasing noise while maintaining the gain of the circuit. Also, the invention allows the input common mode range to include one or both supplies. The invention produces this slew rate enhancement through the use of gain stages that can be incorporated in a variety of electronic circuits. For instance, the invention can be incorporated into telecommunications-type devices, including cellular or PCS telephones, battery powered or low power devices, and most electronic circuits that utilize amplifier circuits.

FIG. 2 is a block diagram illustrating a high level view of an embodiment of the invention. This embodiment begins with an input signal 200, which can be a differential input signal as shown in FIG. 1. Input signal 200 is applied to a current limited stage 201, and this stage is similar to input stage 20 of FIG. 1. Input signal 200 is amplified by current limited stage 201, and the resulting amplified signal is then applied to a high current stage 202. In this embodiment, and unlike the circuit shown in FIG. 1, the amplified signal is applied to high current stage 202 in such a manner that high current stage 202 is not constrained by the limited current of stage 201. High current stage 202 thus has a much higher maximum current than current limited stage 201. High current stage 202 then passes a higher current signal on to a capacitor 203, and capacitor 203 can be connected to a path to ground 204 (as shown in FIG. 2) or to additional circuit elements. The use of a higher current signal can increase the slew rate of the overall circuit.

FIG. 3 is a schematic diagram of an input circuit 300 commonly used in single supply amplifiers. Input circuit 300 includes an input stage 312 and an output stage 314. Input stage 312 receives and amplifies an input signal, and then passes this amplified signal on to output stage 314. Output stage 314 can utilize the current supplied by input stage 312 via the amplified input signal to charge a pair of capacitors 306 and 307, and can pass the current on to other circuit elements outside input circuit 300.

Input stage 312 has a pair of transistors 301 and 302 that form a simple differential pair. Transistor 301 includes an emitter (or source) terminal 316, a base (or gate) terminal 318, and a collector (or drain) terminal 320. Transistor 302 includes an emitter terminal 322, a base terminal 324, and a collector terminal 326. Transistors 301 and 302, as well any or all of the other transistors disclosed herein, can be bipolar junction transistors such as p-n-p or n-p-n bipolar junction transistors. Alternatively, the transistors disclosed herein can be other types of transistors or devices, such as field effect transistors. Transistors may be made of single devices as disclosed herein, or may use multiple devices such as added emitter followers, Darlington connectors, or other composite transistor connectors.

A differential pair is a two-transistor amplifier in which a differential input signal 328 is applied to base terminals 318 and 324 of the two transistors 301 and 302 over a pair of input lines 327 and 329. The output is then taken differentially from collector terminals 320 and 326. In the differential pair, emitter terminals 316 and 322 are connected together to a constant current generator 303. Current generator 303 supplies current to input stage 312, and typically has a fixed maximum limit.

Collectors 320 and 326 of transistors 301 and 302 are loaded with a pair of resistors 304 and 305. Resistors 304 and 305 provide a buffer between the differential pair and a path to ground 330, without which the current in input stage 312 would flow directly and fiercely to ground and the circuit would not function. Path to ground 330 can include additional circuitry that is not shown here.

Output stage 314 includes a pair of transistors 308 and 309 that are electrically coupled to input stage 312. More specifically, transistors 308 and 309 have emitter terminals 332 and 334 that are electrically coupled to collectors 320 and 326 of transistors 301 and 302, and that are electrically coupled to resistors 304 and 305. Transistors 308 and 309 also include base terminals 336 and 338 that are coupled to a reference voltage input line 344, and collector terminals 340 and 342 that are coupled to output lines 310 and 311. Transistors 308 and 309 can drive a pair of capacitors 306 and 307 (which may be a combination of parasitic and compensation capacitance) via output lines 310 and 311, and can drive additional circuitry which is not shown.

Capacitors 306 and 307 may be connected to a path to ground 346 (as shown), or connected to other circuit elements that are not relevant to input circuit 300 for the purposes of this description. Reference voltage input line 344 carries a reference voltage 345, which is typically set such that transistors 308 and 309 conduct the same amount of current as transistors 301 and 302 when input circuit 300 is in a balanced, quiescent state (i.e. when differential input signal 328 is around zero).

The transconductuance gain of input circuit 300 in FIG. 3 for a small differential input voltage signal 328 applied between base terminals 318 and 324 of transistors 301 and 302 is approximately the transconductance of a differential pair, given as follows:

$$I_{out} = gm \cdot \frac{V_{in}}{2}$$

where $I_{out}$ represents the change (from the balanced state) in one of the currents on output lines 310 or 311, $V_{in}$ represents differential input signal 328, and gm represents the small signal transconductance of the input transistors 301 and 302.

The maximum output current occurs when a relatively large differential voltage is applied by differential input signal 328. Suppose differential input signal 328 is increased to the point where all of the current from current generator 303 flows through transistor 302, and no current flows through transistor 301. A low or zero current signal is thus applied to emitter terminal 332 of transistor 308, and a high current signal is applied to emitter terminal 334 of transistor 309. Under these conditions, transistor 308 will open since reference voltage signal 344 provides a higher current at base terminal 336 than the low or zero current at emitter terminal 332, and current will therefore flow through transistor 308. Transistor 309, on the other hand, will close since reference voltage signal 344 provides a current at base terminal 338 that is lower than the high current signal at emitter terminal 334, and current will not be permitted to flow through transistor 309.

The closing of transistor 309 causes the current on output line 311 to approach zero, and the opening of transistor 308 causes the current on output line 310 to double (thus making the current on output line 310 equal to the current generated by current generator 303). Accordingly, the maximum output current for circuit 300 in FIG. 3 is limited to the input current provided by current generator 303.

FIG. 4 is a schematic diagram of an input circuit 400 according to an embodiment of the invention where a high current stage, similar to high current stage 202 of FIG. 2, has been added to the system. This high current stage is provided here by a gain stage 418. Input circuit 400 also includes an input stage 416 and an output stage 420, similar to input circuit 300 of FIG. 3. Gain stage 418 is situated between input stage 416 and output stage 420, and functions as an intermediary to prevent the low current operation of input stage 416 from restricting the current flow in output stage 420.

Input stage 416 includes transistors 401 and 402 that form a simple differential pair, similar to the differential pair in FIG. 3. Transistors 401 and 402 include base terminals 422 and 424 that are coupled to input lines 426 and 428, where input lines 426 and 428 carry a differential input signal 430. Transistors 401 and 402 also include emitter terminals 432 and 434 that are coupled to a current generator 403. As in FIG. 3, current generator 403 supplies a constant current to input stage 416, and typically has a fixed maximum limit. Finally, transistors 401 and 402 include collector terminals 436 and 438 that are loaded with resistors 404 and 405 that are in turn coupled to a path to ground 448.

Gain stage 418 is made up of transistors 412 and 413. The addition of transistors 412 and 413 allows the maximum output current to be greater than the current supplied by current generator 403. Here, the amplified input signal generated by input stage 416 is used primarily to operate transistors 412 and 413 of gain stage 418, and is not used to feed current into output stage 420. This is done by coupling collectors 436 and 438 of resistors 401 and 402 to a pair of base terminals 440 and 442 on transistors 412 and 413. Now current flowing from collectors 436 and 438 will control transistors 412 and 413 of gain stage 418. Transistors 412 and 413 also include collector terminals 444 and 446 that are coupled to the path to ground 448, and emitter terminals 450 and 452 that are coupled to output stage 420.

Output stage 420 is constructed in similar fashion to output stage 314 of FIG. 3. Output stage 420 includes a pair of transistors 408 and 409 that are coupled to output lines 410 and 411, and can include a pair of capacitors 406 and 407 (which again may be a combination of parasitic and compensation capacitance). Output lines 410 and 411 can be coupled to additional circuitry that is not relevant to input circuit 400 for the purposes of this description, and which is therefore not shown. Capacitors 406 and 407 are coupled to output lines 410 and 411, and can be coupled to a path to ground 454 (as shown), or to additional circuitry (not shown). Transistors 408 and 409 can drive capacitors 406 and 407 over output lines 410 and 411.

Transistors 408 and 409 include emitter terminals 456 and 458, collector terminals 460 and 462, and base terminals 464 and 466. Emitter terminals 456 and 458 are coupled to gain stage 418 via emitter terminals 450 and 452 of transistors 412 and 413. Collector terminals 460 and 462 are coupled to output lines 410 and 411. Base terminals 464 and 466 are coupled to a reference voltage line 468 that carries a reference voltage 470.

Reference voltage 470 can be set in a variety of ways, depending on the required performance of input circuit 400. This, as well as the advantages of input circuit 400, can be demonstrated through some examples. The following examples are intended only as illustrations of the performance advantages of input circuit 400, and should not be construed as limiting the invention.

In the first example, reference voltage 470 can be set so that the transconductance gain of input circuit 400 of FIG. 4 is the same as the transconductance gain of input circuit 300 of FIG. 3. This can be done by making the sum of the transconductances (gm) of transistors 412 and 408 equal to the inverse of the resistance of resistor 404. Similarly, the sum of the transconductances of transistors 413 and 409 could be made equal to the inverse of the resistance of resistor 405. This can make the gains of FIGS. 3 and 4 the same.

The maximum output current in FIG. 4 can occur as it does in FIG. 3, when a relatively large differential voltage is applied by differential input signal 430. Suppose differential input signal 430 is increased to the point where all of the current provided by current generator 403 flows though transistor 402, and no current flows through transistor 401. This can cause the voltage drop across resistor 405 to double over its quiescent value, and the voltage drop across resistor 404 to approach zero. This voltage can be applied to transistors 412, 413, 408, and 409, causing the current on output line 411 to approach zero, and the current on output line 410 to increase non-linearly. Here, the current on output line 410 does not have an abrupt limit as it does in input circuit 300 of FIG. 3. The current on output line 410 is limited only by the amount of voltage applied and the transistor gain at high currents.

In the second example, the advantage of input circuit 400 is demonstrated using numerical values. Here, the quiescent value of the voltage drop across resistors 404 and 405 can be set to 250 mV. This is a typical value for a circuit which allows the common mode voltage of differential input signal 430 to become slightly negative and still maintain an amplifier function. The resistance of resistors 404 and 405 can then be set to 10 k ohms. This means that the current provided by current generator 403 has a value of about 50 uA. For the gain in FIG. 4 to equal the gain in FIG. 3, the sum of the transconductances of transistors 412 and 408 must be equal the inverse of the resistance of resistor 404. This determines the operating current of transistors 412 and 408. For a bipolar transistor:

$$gm = \frac{I_C}{V_t}$$

where $I_C$ is the collector current and $V_t$ is the thermal voltage, which is around 26 mV at 27° C.

For the sum of gm in transistors 412 and 408 to equal 1/10 k ohms, the quiescent collector current of transistors 412 and 408 could be set to 1.3 uA via reference voltage 470. This can also cause the quiescent collector current in transistors 413 and 409 to be set to 1.3 uA. Note that this results in a significant power savings compared to transistors 308 and 309 in FIG. 3, which would run at 25 uA collector current given the assumption of current generator 303 providing 50 uA current and transistors 308 and 309 having the same currents as transistors 301 and 302.

The maximum output current may be calculated from the current-voltage relation for a bipolar transistor:

$$I_C = I_S \cdot \exp\left(\frac{V_{be}}{V_t}\right)$$

where $I_C$ represents the collector current, $I_S$ represents a current parameter dependent on transistor construction, exp ( ) represents constant e (2.72 . . . ) raised to a power, $V_{be}$ represents the base emitter voltage, and $V_t$ represents the thermal voltage.

It is also useful to calculate the change in collector current due to the change in $V_{be}$:

$$\frac{I_{C1}}{I_{C2}} = \exp\left(\frac{(V_{be1} - V_{be2})}{V_t}\right)$$

In this numerical example, the change in $V_{be}$ of each transistor 412 and 408 can be half the change in voltage across resistor 404. The change in $V_{be}$ can be 125 mV, as the quiescent drop across resistor 405 doubles from 250 mV to 500 mV, and the drop across resistor 404 reduces from 250 mV to zero. This can give an increase in the current in output line 410 of 122 times the quiescent current of 1.3 uA, resulting in a maximum current output of over 150 uA, three times that of input circuit 300 in FIG. 3.

Again, the values provided above are intended for use as examples and illustrations of the invention only; many values of impedance and current are possible depending on specific requirements in a circuit.

Accordingly, systems and methods of the invention have been described for increasing the slew rate of a circuit by minimizing the effect of a current limited stage. Unlike previously developed techniques in which current limited stages have a direct effect on subsequent circuit elements, the present invention utilizes an intervening gain stage that uses the signal from the current limited stage as a control signal, and not as a current providing signal. This results in an output stage that is free to maximize the current that flows through it. The present invention thus provides a method of increasing the slew rate of a circuit without introducing additional noise or decreasing the available gain, provides the possibility of increasing slew rate in a circuit while still allowing for single supply operation on a low voltage supply, and allows for further objectives that are disclosed or understood throughout the specification and drawings.

While various embodiments of the invention have been shown and described, it will be apparent to those skilled in the art that numerous alterations may be made without departing from the inventive concepts presented herein. Thus, the invention is not to be limited except in accordance with the following claims and their equivalents.

What is claimed is:

1. An amplifier circuit comprising:
    an input stage capable of receiving and amplifying an input signal;
    a gain stage capable of further amplifying the input signal; and
    an output stage capable of charging a capacitance of the amplifier circuit and outputting the amplified input signal;
    wherein the gain stage comprises:
    a pair of gain transistors, each gain transistor comprising a base, an emitter, and a collector,
    wherein the bases of the gain transistors are electrically coupled to the input stage,
    wherein the collectors of the gain transistors are electrically coupled to a path to ground, and
    wherein the emitters of the gain transistors are electrically coupled to the output stage.

2. An amplifier circuit comprising:
    an input stage capable of receiving and amplifying an input signal;
    a gain stage capable of further amplifying the input signal, wherein the gain stage is electrically coupled to the input stage; and
    an output stage capable of charging a capacitance of the amplifier circuit and outputting the amplified input signal, wherein the output stage comprises:
    a pair of output transistors, each output transistor comprising a base, an emitter, and a collector, wherein the emitters are electrically coupled to the gain stage,
    a reference voltage line electrically coupled to the bases of the output transistors, the reference voltage line configured to carry a reference voltage signal, and
    a pair of output lines electrically coupled to the collectors of the output transistors.

3. An amplifier circuit comprising:
    an input stage capable of receiving and amplifying an input signal, wherein the input stage comprises:
    a differential pair of transistors, each transistor comprising a base, an emitter, and a collector,
    a current generator electrically coupled to the emitters of the differential pair of transistors, wherein the current generator is configured to supply the amplifier circuit with a constant current,
    a pair of input lines electrically coupled to the bases of the differential pair of transistors, the input lines configured to carry an input signal,
    a pair of resistors electrically coupled to the collectors of the differential pair of transistors, and
    a path to ground electrically coupled to the pair of resistors;

a gain stage capable of further amplifying the input signal, wherein the gain stage is electrically coupled to the input stage; and an output stage capable of charging a capacitance of the amplifier circuit and outputting the amplified input signal, wherein the output stage is electrically coupled to the gain stage.

4. The amplifier circuit of claim 1, wherein each transistor of the pair of gain transistors comprises a transistor selected from the group consisting of bipolar junction transistors and field-effect transistors.

5. The amplifier circuit of claim 2, wherein the output stage further comprises a capacitor electrically coupled to the output lines.

6. The amplifier circuit of claim 2, wherein each transistor of the pair of output transistors comprises a transistor selected from the group consisting of bipolar junction transistors and field-effect transistors.

7. The amplifier circuit of claim 2, wherein the reference voltage signal is set such that the output transistors conduct the same amount of current as does the input stage when the input signal is around zero.

8. The amplifier circuit of claim 5, wherein the capacitor comprises a plurality of capacitors.

9. The amplifier circuit of claim 5, wherein the capacitor comprises inherent capacitance in the amplifier circuit.

10. An amplifier circuit comprising:
  an input stage capable of receiving and amplifying an input signal, comprising:
    a differential pair of transistors, each transistor comprising a base, an emitter, and a collector;
    a current generator electrically coupled to the emitters of the differential pair of transistors;
    a pair of input lines electrically coupled to the bases of the differential pair of transistors, the input lines configured to carry an input signal;
    a pair of resistors electrically coupled to the collectors of the differential pair of transistors; and
    a path to ground electrically coupled to the pair of resistors;

a gain stage capable of further amplifying the input signal, comprising:
    a pair of gain transistors, each gain transistor comprising a base, an emitter, and a collector,
    wherein the bases of the gain transistors are electrically coupled to the collectors of the differential pair of transistors, and
    wherein the collectors of the gain transistors are electrically coupled to the path to ground; and an output stage capable of charging a capacitance of the amplifier circuit and outputting the amplified input signal, comprising:
    a pair of output transistors, each output transistor comprising a base, an emitter, and a collector,
    wherein the emitters of the pair of output transistors are electrically coupled to the emitters of the gain transistors;
    a reference voltage line electrically coupled to the bases of the output transistors, the reference voltage line configured to carry a reference voltage signal; and
    a pair of output lines electrically coupled to the collectors of the output transistors.

11. The amplifier circuit of claim 10, wherein each transistor of the differential pair comprises a transistor selected from the group consisting of bipolar junction transistors and field-effect transistors.

12. The amplifier circuit of claim 10, wherein each transistor of the pair of gain transistors comprises a transistor selected from the group consisting of bipolar junction transistors and field-effect transistors.

13. The amplifier circuit of claim 10, wherein the output stage further comprises a capacitor electrically coupled to the output lines.

14. The amplifier circuit of claim 10, wherein each transistor of the pair of output transistors comprises a transistor selected from the group consisting of bipolar junction transistors and field-effect transistors.

* * * * *